US009646905B2

(12) United States Patent
Lin et al.

(10) Patent No.: US 9,646,905 B2
(45) Date of Patent: May 9, 2017

(54) FINGERPRINT SENSOR PACKAGE AND METHOD FOR FABRICATING THE SAME

(71) Applicant: Egis Technology Inc., Taipei (TW)

(72) Inventors: Gong-Yi Lin, Taipei (TW); Chen-Ying Tien, Taipei (TW)

(73) Assignee: Egis Technology Inc., Taipei (TW)

( * ) Notice: Subject to any disclaimer, the term of this patent is extended or adjusted under 35 U.S.C. 154(b) by 0 days.

(21) Appl. No.: 14/714,200

(22) Filed: May 15, 2015

(65) Prior Publication Data

US 2016/0210496 A1    Jul. 21, 2016

(30) Foreign Application Priority Data

Jan. 19, 2015 (TW) .............................. 104101627 A

(51) Int. Cl.
*H01L 27/14* (2006.01)
*H01L 23/29* (2006.01)
(Continued)

(52) U.S. Cl.
CPC ........ *H01L 23/298* (2013.01); *G06K 9/00053* (2013.01); *H01L 23/291* (2013.01); *H01L 23/295* (2013.01); *H01L 23/3135* (2013.01); *H01L 23/3128* (2013.01); *H01L 24/29* (2013.01); *H01L 24/32* (2013.01); *H01L 24/48* (2013.01); *H01L 24/73* (2013.01); *H01L 25/0655* (2013.01); *H01L 25/0657* (2013.01); *H01L 2224/04042* (2013.01); *H01L 2224/2919* (2013.01); *H01L 2224/32145* (2013.01); *H01L 2224/32225* (2013.01); *H01L 2224/48091* (2013.01); *H01L 2224/48227* (2013.01); *H01L 2224/48235* (2013.01);
(Continued)

(58) Field of Classification Search
CPC ..... H01L 25/16; H01L 23/295; H01L 21/565; H01L 23/3107; H01L 23/298; H01L 23/291
See application file for complete search history.

(56) References Cited

U.S. PATENT DOCUMENTS

| 6,448,635 | B1 * | 9/2002 | Glenn | .................... | H03H 9/059 |
| | | | | | 257/671 |
| 6,853,069 | B2 * | 2/2005 | Akram | .................. | H01L 21/563 |
| | | | | | 257/706 |

(Continued)

FOREIGN PATENT DOCUMENTS

| CN | 100372116 C | 2/2008 |
| CN | 104194271 A | 12/2014 |

(Continued)

OTHER PUBLICATIONS

Taiwan Patent Office, Office Action, Patent Application Serial No. 104101627, Dec. 22, 2015, Taiwan.

(Continued)

*Primary Examiner* — Thanh Y Tran

(57) ABSTRACT

The invention provides a fingerprint sensor package and a method for fabricating the same. The fingerprint sensor package includes a substrate. A first fingerprint sensor die is disposed on the substrate. A molding compound layer is disposed on the substrate, encapsulating the first fingerprint sensor die. Filler are dispersed in the molding compound layer. The diameter of the fillers is less than or about 20 μm.

10 Claims, 9 Drawing Sheets

(51) Int. Cl.
*G06K 9/00* (2006.01)
*H01L 23/31* (2006.01)
*H01L 23/00* (2006.01)
*H01L 25/065* (2006.01)

(52) U.S. Cl.
CPC ............... *H01L 2224/73265* (2013.01); *H01L 2924/00014* (2013.01); *H01L 2924/157* (2013.01); *H01L 2924/15311* (2013.01); *H01L 2924/181* (2013.01)

(56) References Cited

U.S. PATENT DOCUMENTS

| | | | |
|---|---|---|---|
| 8,717,775 B1 | 5/2014 | Bolognia et al. | |
| 2005/0180609 A1* | 8/2005 | Bolis | G06K 9/0002 382/116 |
| 2009/0045498 A1* | 2/2009 | Braden | H01L 23/24 257/687 |
| 2011/0127998 A1* | 6/2011 | Elian | B82Y 25/00 324/219 |
| 2012/0139063 A1 | 6/2012 | Lo et al. | |
| 2012/0261689 A1* | 10/2012 | Appelt | H01L 21/4832 257/98 |
| 2013/0154086 A1* | 6/2013 | Yu | H01L 23/3121 257/734 |
| 2014/0103943 A1 | 4/2014 | Dunlap et al. | |
| 2014/0131896 A1* | 5/2014 | Yu | H01L 23/3121 257/782 |
| 2014/0254850 A1* | 9/2014 | Elian | H04R 17/025 381/355 |
| 2014/0332983 A1 | 11/2014 | Ho et al. | |
| 2015/0269407 A1* | 9/2015 | Chou | G06K 9/00053 382/124 |
| 2016/0111610 A1* | 4/2016 | Ota | H01L 21/02601 257/89 |

FOREIGN PATENT DOCUMENTS

| | | |
|---|---|---|
| TW | I243437 | 11/2005 |
| TW | 200915533 A | 4/2009 |
| TW | M484793 | 8/2014 |

OTHER PUBLICATIONS

Joon-Yeob Lee et al., "Study on Board Level Reliability Test of Package on Package (PoP) with 2nd Level Underfill," Electronic Components and Technology Conference, 2007. ECTC '07. Proceedings. 57$^{th}$, Jul. 2007, 7 pages, IEEE, US.

M. Ding et al., "Filler Dispersion in Epoxy Mold Compound and its Effect on the Reliability of Cu/Low-k Devices in Plastic Ball Grid Array Packages," Conference: 41st Annual International Symposium on Microelectronics, IMAPS 2008, Nov. 2008, 1 page, IMAPS, US.

* cited by examiner

US 9,646,905 B2

FINGERPRINT SENSOR PACKAGE AND METHOD FOR FABRICATING THE SAME

CROSS REFERENCE TO RELATED APPLICATIONS

This Application claims priority of Taiwan Patent Application No. 104101627, filed on Jan. 19, 2015, the entirety of which is incorporated by reference herein.

BACKGROUND OF THE INVENTION

Field of the Invention

The present invention relates to a fingerprint sensor package and a method for fabricating a fingerprint sensor package, and in particular to a fingerprint sensor package and a method for fabricating a fingerprint sensor package with a reduced volume.

Description of the Related Art

In recent years, with the growing demand for personal data confidentiality, the security and protection of confidential information stored in various electronic products needs improvement. For this reason, identification technology using fingerprint authentication has been developed. In order to ensure miniaturization and multi-functionality of electronic products, fingerprint sensor packages have to be small and satisfy sensitivity requirements. Current fingerprint sensor packages, however, cannot meet the aforementioned requirements due to the limitations caused by the thickness of the molding material layer and the diameter of the fillers within the molding layer.

Thus, a novel fingerprint sensor package and a method for fabricating the fingerprint sensor package are desirable.

BRIEF SUMMARY OF THE INVENTION

A fingerprint sensor package and a method for fabricating the same are provided. An exemplary embodiment of a fingerprint sensor package includes a substrate. A first fingerprint sensor die is disposed on the substrate. A molding compound layer is disposed on the substrate, encapsulating the first fingerprint sensor die. Fillers are dispersed in the molding compound layer. The diameter of the fillers is less than or about 20 μm.

An exemplary embodiment of a method for fabricating a fingerprint sensor package includes providing a substrate. A first fingerprint sensor die is disposed on the substrate. A compression molding process is performed to form a molding compound layer on the substrate, wherein the molding compound layer encapsulates a top surface and a side surface of the first fingerprint sensor die. Fillers are dispersed in the molding compound layer. The diameter of the fillers is less than or about 20 μm.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
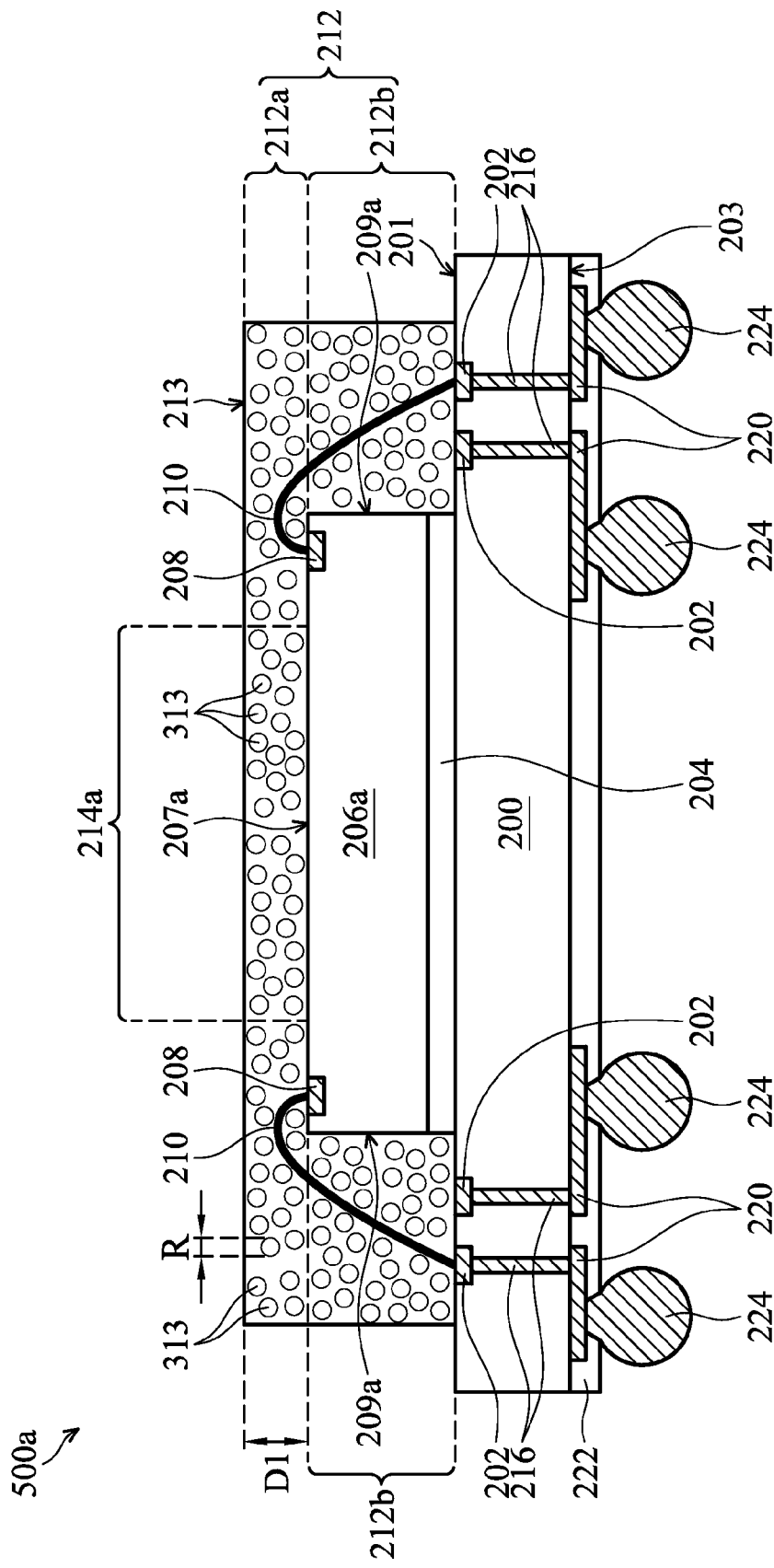
FIGS. 1-3 are cross-sectional views of a fingerprint sensor package in accordance with some embodiments of the invention.

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

Embodiments provide a fingerprint sensor package and a method for fabricating a fingerprint sensor package. The fingerprint sensor package is a wafer-level package using a molding compound layer including fillers as an encapsulation layer of the fingerprint sensor package. Also, the diameter of the fillers is less than or about 20 μm. The thickness of the molding compound layer can therefore be reduced, and the height of the fingerprint sensor package will be reduced too, thereby shrinking the volume of the package. Additionally, the fingerprint sensor package is fabricated using a compression molding process to form the molding compound layer including the fillers dispersed therein.

FIG. 1 is a cross-sectional view of a fingerprint sensor package 500a in accordance with some embodiment of the invention. FIG. 1 also illustrates a fingerprint sensor package structure for a single die. As shown in FIG. 1, the fingerprint sensor package 500a includes a substrate 200, a fingerprint sensor die 206a and a molding compound layer 212. In one embodiment, the substrate 200 may include a semiconductor substrate, such as a silicon substrate. As shown in FIG. 1, the substrate 200 has a top surface 201 and a bottom surface 203 opposite to the top surface 201. The substrate 200 has circuits (not shown), pads 202, 220 and metal vias 216. The circuits are respectively disposed on the top surface 201 and the bottom surface 203. The metal via 216 passes through the substrate 200. The pads 202, 220 and the metal vias 216 connected between the pads 202, 220 form an interconnection structure of the substrate 200 to transmit input/output (I/O), ground or power signals of the fingerprint sensor die 206a. Additionally, the substrate 200 may further include a solder mask layer 222 and a plurality of conductive structures 224. The solder mask layer 222 is formed on the bottom surface 203 of the substrate 200. The solder mask layer 222 has a plurality of openings, and part of the pads 220 are exposed from the openings. The conductive structures 224 are formed in the openings of the solder mask layer 222, and are connected to the corresponding pads 220. In one embodiment, the conductive structure 224 may include conductive bump structure or conductive pillar structure.

As shown in FIG. 1, the fingerprint sensor die 206a of the fingerprint sensor package 500a is disposed on the top surface 201 of the substrate 200 through an adhesion layer 204, for example, a conductive glue. In one embodiment, the fingerprint sensor die 206a includes a plurality of pads 208 formed on a top surface 207a thereof. The pads 208 may serve as input/output (I/O) connections of the fingerprint sensor die 206a. The pads 208 of the fingerprint sensor die 206a may be electrically connected to a carrier, such as a printed circuit board (PCB) (not shown). Additionally, the fingerprint sensor die 206a includes a sensing area 214a, which is surrounded by the pads 208 and close to the top surface 207a. The sensing area 214a is provided for a finger touching thereon to detect the fingerprint of a finger.

As shown in FIG. 1, the molding compound layer 212 of the fingerprint sensor package 500a is disposed on the top surface 201 of the substrate 200. The molding compound layer 212 encapsulates the top surface 207a and a side surface 209a of the fingerprint sensor die 206a, and a side surface of the adhesion layer 204. In some embodiments, the molding compound layer 212 is formed of a non-conductive material comprising silicon, polyimide (PI), epoxy, polymethyl methacrylate (PMMA), diamond-like carbon (DLC), or the like. In some embodiments, the molding compound layer 212 may include a moldable polymer, for example, an ultraviolet (UV) polymer or a thermally cured polymer.

It should be noted that the molding compound layer (molding compound layer 212) is a molding compound layer including fillers 313. For example, the molding compound layer (molding compound layer 212), such as an epoxy-based molding compound, is mainly composed of epoxy, hardener, flame retardant, catalyst, coupling agent, releasing, coloring agent and filler. The fillers 313 are inorganic fillers or the like. The inorganic fillers are particles composed of a material including silicon dioxide, aluminum, aluminum oxide or any combination thereof. The fillers 313 are dispersed in the molding compound layer 212, and a diameter R of the fillers 313 is less than or about 20 μm. Therefore, a first portion 212a of the molding compound layer 212 over the top surface 207a (including the sensing area 214a) of the fingerprint sensor die 206a has the fillers 313 dispersed therein. In one embodiment, a second portion 212b of the molding compound layer 212 surrounding the side surface 209a of the fingerprint sensor die 206a may also have the fillers 313 dispersed therein. In one embodiment, because the diameter R of the fillers 313 dispersed in the first portion 212a of the molding compound layer 212 is less than or about 20 μm, the thickness D1 of the first portion 212a may be within a range from about 30 μm to about 50 μm, for example, about 40 μm.

In one embodiment, because the diameter R of the fillers 313 dispersed in the molding compound layer 212, especially in the first portion 212a of the molding compound layer 212, is less than or about 20 μm, a space between the top surface 207a of the fingerprint sensor die 206a and a top surface 213 of the molding compound layer 212 (i.e. the thickness D1 of the first portion 212a of the molding compound layer 212) can be further reduced. Accordingly, the sensitivity of fingerprint recognition of the fingerprint sensor die 206a can be improved. Also, the height and volume of the fingerprint sensor package can be reduced.

In another embodiment, the number of fillers in the first portion 212a of the molding compound layer 212 over the top surface 207a (including the sensing area 214a) of the fingerprint sensor die 206a can be zero. Because the first portion 212a of the molding compound layer 212 does not have any filler dispersed therein, the thickness D1 of the first portion 212a can be further reduced to be less than or about 10 μm. Additionally, the number of fillers in the second portion 212b of the molding compound layer 212 surrounding the side surface 209a of the fingerprint sensor die 206a may also be zero. In another embodiment, the first portion 212a and the second portion 212b of the molding compound layer 212 may be formed respectively by using different process steps, making the number of fillers in the first portion 212a and the second portion 212b zero (i.e. no filler) during the process steps.

Figure 2:
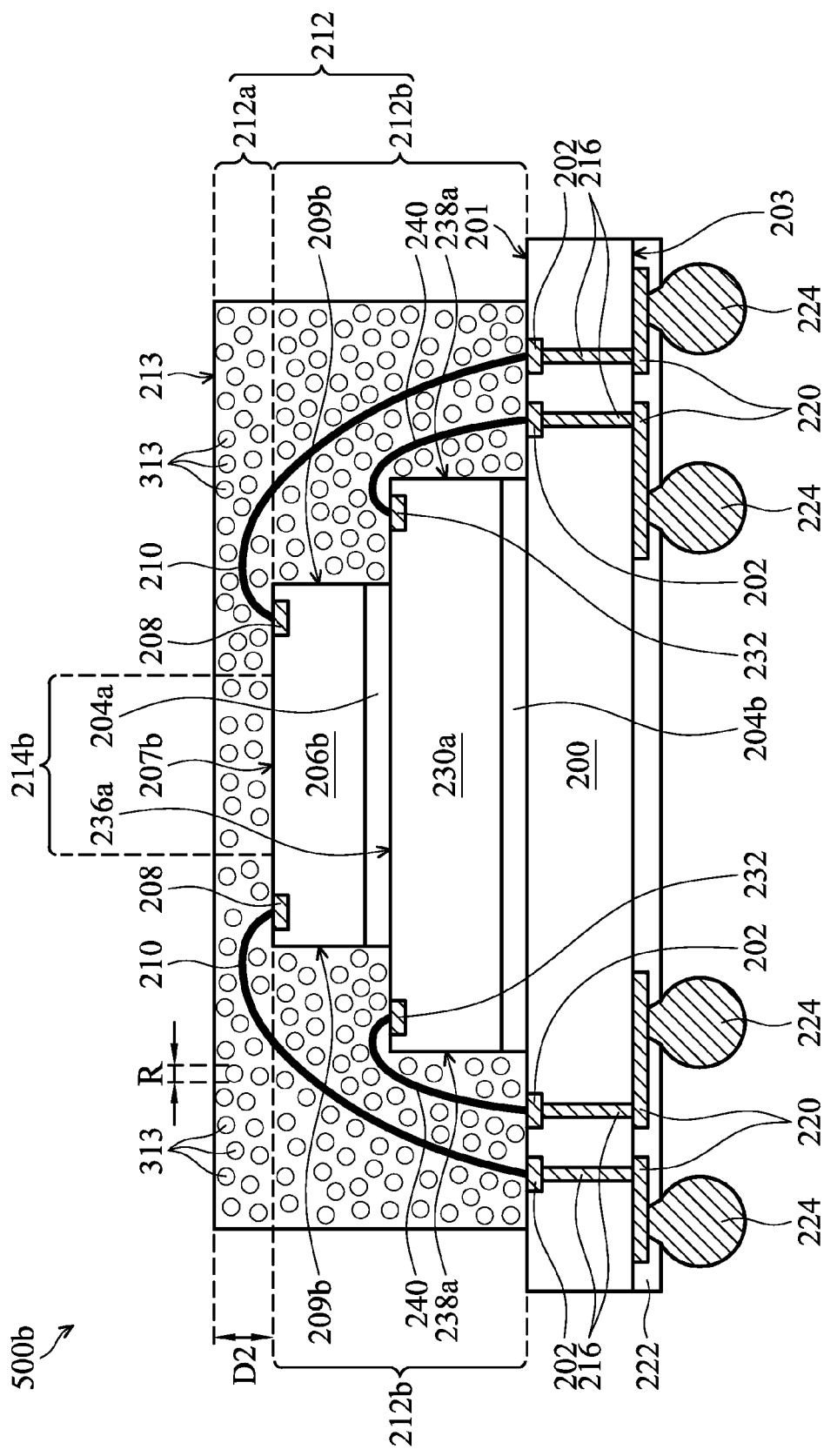

FIG. 2 is a cross-sectional view of a fingerprint sensor package 500b in accordance with some embodiment of the invention. FIG. 2 illustrates a fingerprint sensor package structure with multi-dies. In the embodiment shown in FIG. 2, the fingerprint sensor package may be formed by using the package on package (POP) technology. The fingerprint sensor package may comprise a fingerprint sensor die and at least one die having other functions, and the fingerprint sensor die is vertically stacked on the die with other functions. In other embodiments, the fingerprint sensor package may have any number of stacked dies without being limited to the disclosed embodiments. Elements of the embodiments that are the same or similar as those previously described with reference to FIG. 1 are not repeated hereinafter for brevity.

As shown in FIG. 2, one of the differences between the fingerprint sensor package 500a (FIG. 1) and the fingerprint sensor package 500b is that the fingerprint sensor package 500b further comprises a second die 230a disposed on the top surface 201 of the substrate 200 through an adhesion layer 204b, for example, a conductive glue. In one embodiment, the fingerprint sensor die 206b of the fingerprint sensor package 500b is vertically stacked on a top surface 236a of the second die 230a and is connected to the top surface 236a of the second die 230a through an adhesion layer 204a, for example, a conductive glue. That is to say, the fingerprint sensor die 206b is separated from the substrate 200 by the second die 230a.

In one embodiment, the second die 230a includes a plurality of pads 232 formed on the top surface 236a thereof. The pads 232 may serve as input/output (I/O) connections of the second die 230a. The fingerprint sensor die 206b covers a portion of the top surface 236a of the second die 230a, so that the pads 232 are exposed without being covered by the fingerprint sensor die 206b. The pads 208 of the fingerprint sensor die 206b and the pads 232 of the second die 230a may respectively be electrically connected to the various pads 202 of the substrate 200 through bonding wires 210 and 240, and may be electrically connected to the carrier of a printed circuit board (PCB) (not shown) through the various metal vias 216, pads 220 and conductive structures 224. In one embodiment, the second die 230a may be a system-on-chip die (SOC die), a sensor die, a memory die or any combination thereof. The SOC die may comprise a logic die. The sensor die may comprise, for example, another fingerprint sensor die or other sensor die, such as a pressure sensor die or thermal sensor die. Additionally, the memory die may comprise, for example, a dynamic random access memory (DRAM).

As shown in FIG. 2, the molding compound layer 212 of the fingerprint sensor package 500b is disposed on the top surface 201 of the substrate 200. The molding compound layer 212 encapsulates a sensing area 214b, a top surface 207b and a side surface 209b of the fingerprint sensor die 206b, a portion of the top surface 236a and a side surface 238a of the second die 230a, and side surfaces of the adhesion layers 204a and 204b. In one embodiment, a first portion 212a of the molding compound layer 212 over the top surface 207b (including the sensing area 214b) of the fingerprint sensor die 206b has the fillers 313 dispersed therein. In one embodiment, a second portion 212b of the molding compound layer 212 surrounding the side surface 209b of the fingerprint sensor die 206b and the side surface 238a of the second die 230a may also have the fillers 313 dispersed therein. The diameter R of the fillers 313 is less than or about 20 μm. In one embodiment, the thickness D2 of the first portion 212a of the molding compound layer 212 may be within a range from about 30 μm to about 50 μm, for example, about 40 μm. In another embodiment, the fingerprint sensor package 500b also has the advantages of high sensitivity and reduced height and volume, which are similar to the fingerprint sensor package 500a (FIG. 1).

In another embodiment, the number of fillers in the first portion 212a of the molding compound layer 212 over the top surface 207b (including the sensing area 214b) of the fingerprint sensor die 206b can be zero. The thickness D2 of the first portion 212a of the molding compound layer 212 can be further reduced to be less than or about 10 μm. Additionally, the number of fillers in the second portion 212b of the molding compound layer 212 surrounding the side surface 209b of the fingerprint sensor die 206b may also be zero (i.e. no filler). In another embodiment, the first portion 212a and the second portion 212b of the molding compound layer 212 may be respectively formed by using different process steps, making the number of fillers in the first portion 212a and the second portion 212b zero (i.e. no filler) during the process steps.

Figure 3:
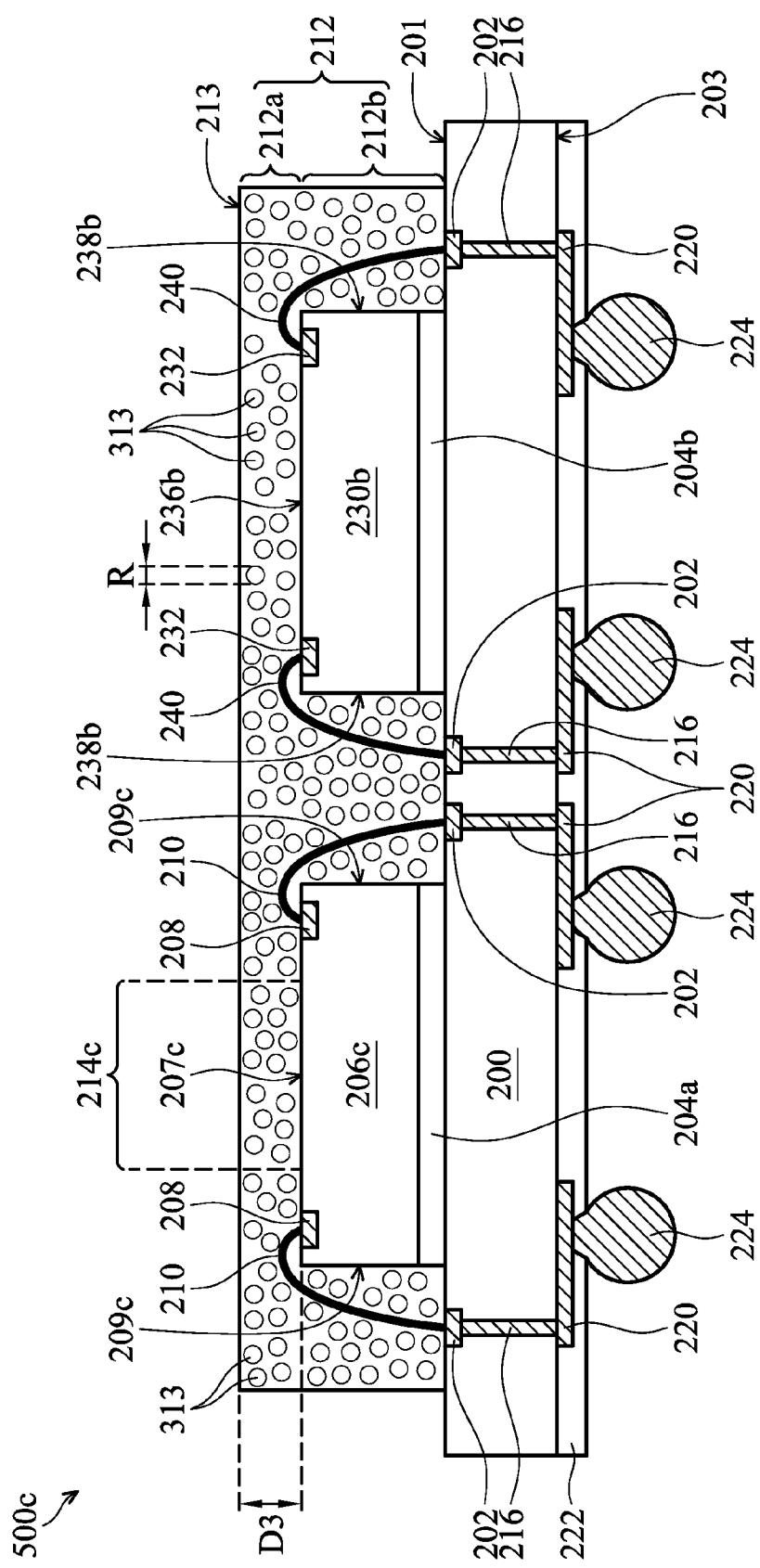

FIG. 3 is a cross-sectional view of a fingerprint sensor package 500c in accordance with some embodiment of the invention. FIG. 3 also illustrates another fingerprint sensor package structure with multi-dies. In the embodiment shown in FIG. 3, the fingerprint sensor package may be formed by using the package in package (PIP) technology. The fingerprint sensor package may comprise a fingerprint sensor die and at least one die having other functions disposed beside the fingerprint sensor die. In other embodiments, the fingerprint sensor package may have any number of dies arranged side by side without being limited to the disclosed embodiments. Elements of the embodiments that are the same or similar as those previously described with reference to FIGS. 1-2 are not repeated hereinafter for brevity.

As shown in FIG. 3, one of the differences between the fingerprint sensor package 500a (FIG. 1) and the fingerprint sensor package 500c is that the fingerprint sensor package 500c further comprises a second die 230b disposed on the top surface 201 of the substrate 200 through an adhesion layer 204b, for example, a conductive glue. In one embodiment, the second die 230b is disposed beside the fingerprint sensor die 206c. Therefore, the fingerprint sensor die 206c and the second die 230b are connected to the top surface 201 of the substrate 200 respectively through the adhesion layers 204a and 204b. The pads 208 of the fingerprint sensor die 206c and the pads 232 of the second die 230b may respectively be electrically connected to various pads 202 of the substrate 200 through bonding wires 210 and 240, and may be electrically connected to the carrier of a printed circuit board (PCB) (not shown) through the various metal vias 216, pads 220 and conductive structures 224. In one embodiment, the second die 230b may be a system-on-chip die (SOC die), a sensor die, a memory die or any combination thereof. The SOC die may comprise a logic die. The sensor die may comprise, for example, another fingerprint sensor die or other sensor die, such as a pressure sensor die or thermal sensor die. Additionally, the memory die may comprise, for example, a dynamic random access memory (DRAM).

As shown in FIG. 3, the molding compound layer 212 of the fingerprint sensor package 500c is disposed on the top surface 201 of the substrate 200. The molding compound layer 212 encapsulates a sensing area 214c, a top surface 207c and a side surface 209c of the fingerprint sensor die 206c, a top surface 236b and a side surface 238b of the second die 230b, and side surfaces of the adhesion layers 204a and 204b. In one embodiment, a first portion 212a of the molding compound layer 212 over the top surface 207c (including the sensing area 214c) of the fingerprint sensor die 206c has the fillers 313 dispersed therein. In one embodiment, a second portion 212b of the molding compound layer 212 surrounding the side surface 209c of the fingerprint sensor die 206c may also have the fillers 313 dispersed therein. The diameter R of the fillers 313 is less than about 20 μm. In one embodiment, the thickness D3 of the first portion 212a of the molding compound layer 212 may be within a range from about 30 μm to about 50 μm, for example, about 40 μm. In some embodiment, the fingerprint sensor package 500c also has the advantages of high sensitivity and reduced height and volume, which are similar to the fingerprint sensor packages 500a (FIGS. 1) and 500b (FIG. 2).

In another embodiment, the number of fillers in the first portion 212a of the molding compound layer 212 over the top surface 207c (including the sensing area 214c) of the fingerprint sensor die 206c can be zero. The thickness D3 of the first portion 212a can be further reduced to be less than or about 10 μm. Additionally, the number of fillers in the second portion 212b of the molding compound layer 212 surrounding the side surface 209c of the fingerprint sensor die 206c may also be zero (i.e. no filler). In one embodiment, the first portion 212a and the second portion 212b of the molding compound layer 212 may be formed respectively by using different process steps, making the number of fillers in the first portion 212a and the second portion 212b zero (i.e. no filler) during the process steps.

Also, the fingerprint sensor packages 500b and 500c in FIGS. 2-3 are fingerprint sensor package structures with multi-dies. Therefore, the density of electronic devices in the fingerprint sensor package can be promoted, and the options of functionality for the fingerprint sensor package can be increased.

Figure 4:
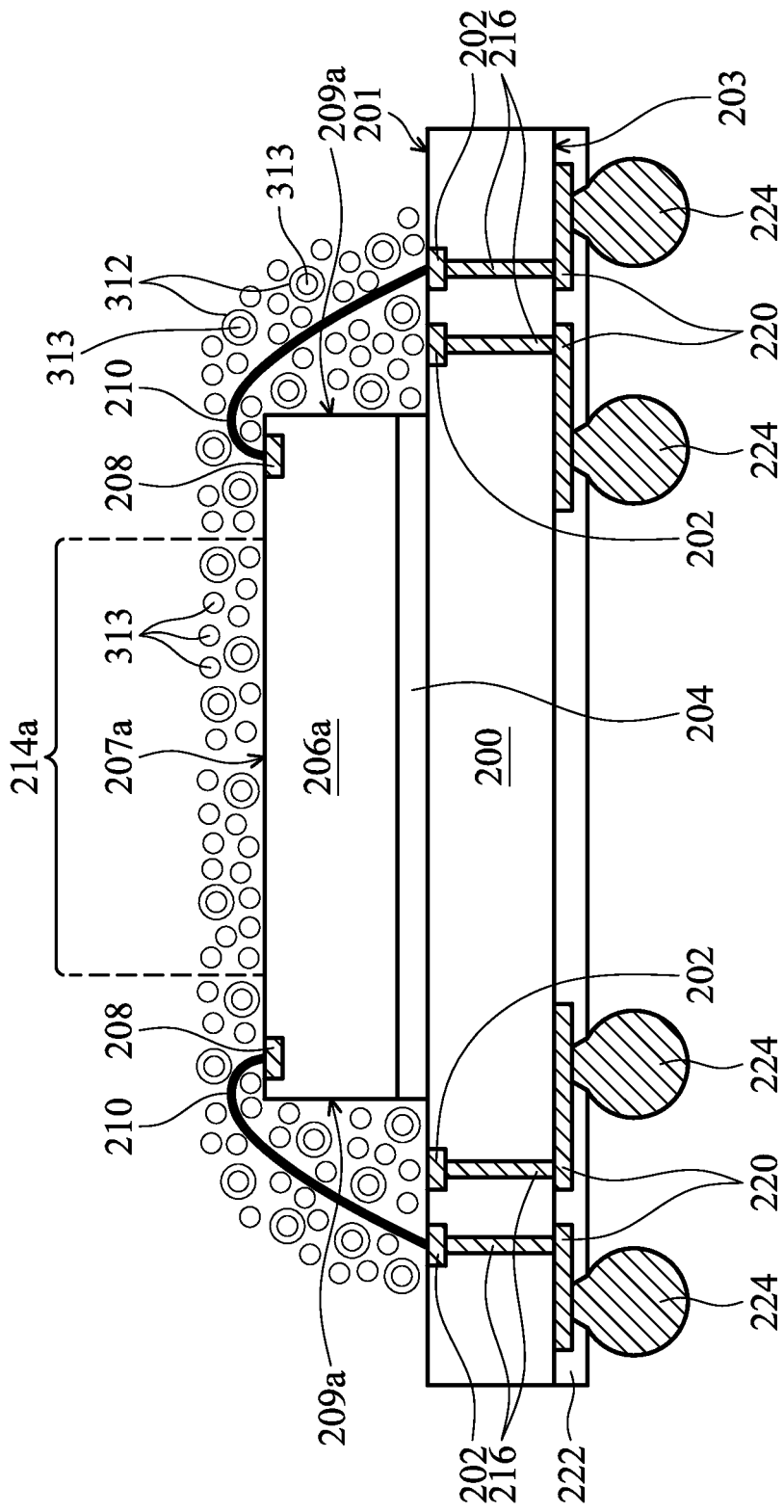
FIGS. 4-6 are cross-sectional views of a fingerprint sensor package during the intermediate process steps of a method for fabricating the fingerprint sensor package in accordance with some embodiments of the invention.
Figure 5:
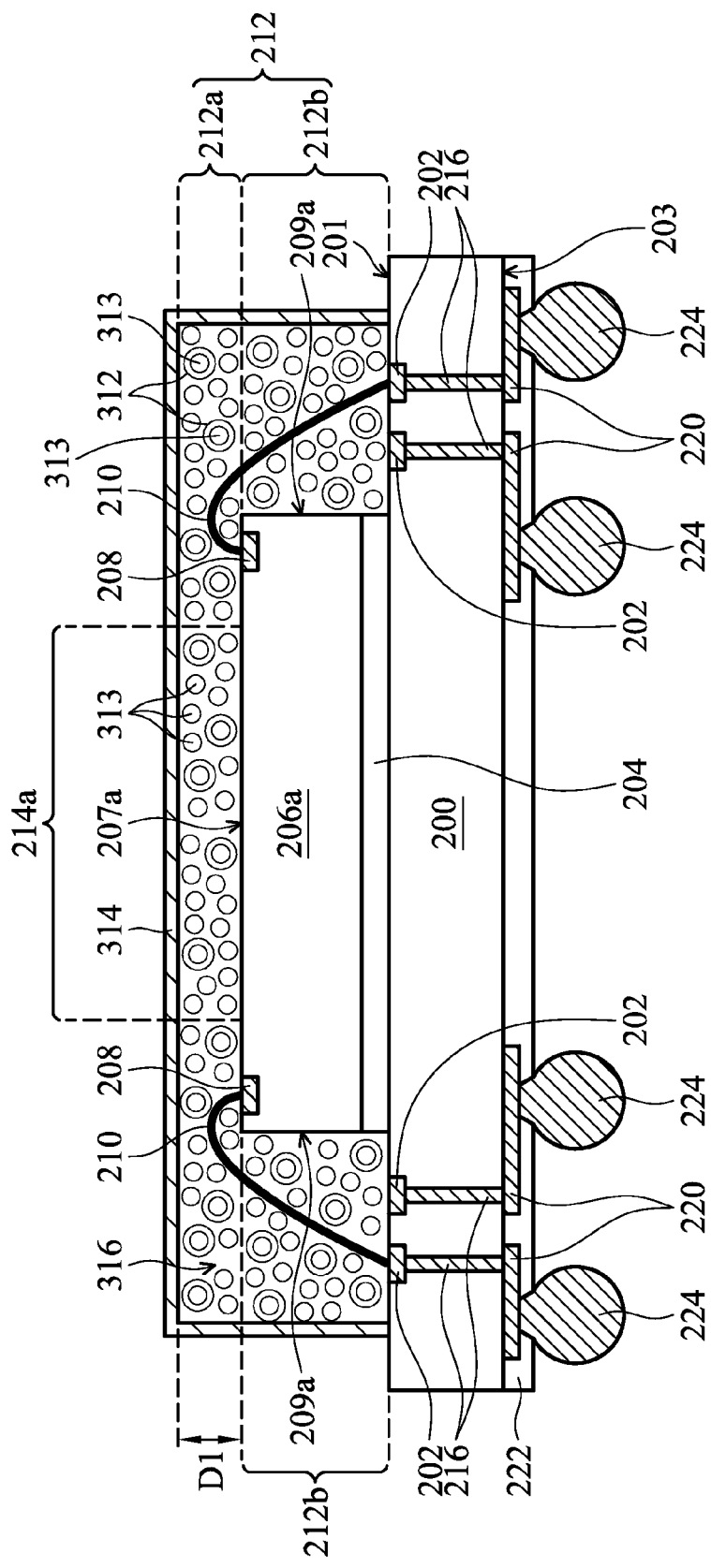
Figure 6:
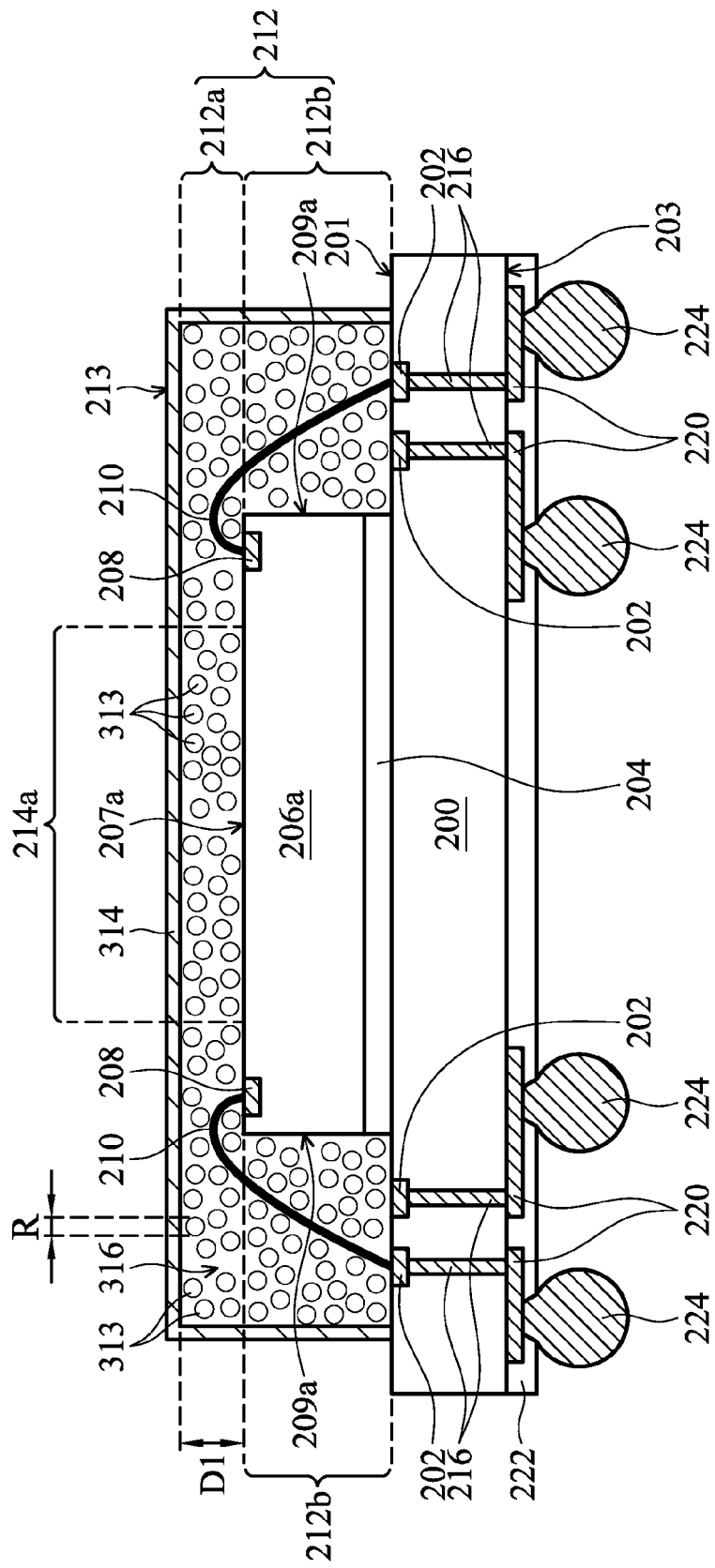

FIGS. 4-6 are cross-sectional views of a fingerprint sensor package during the intermediate process steps of a method for fabricating the fingerprint sensor package in accordance with some embodiments of the invention. The method shown in FIGS. 4-6 is used to fabricate the fingerprint sensor package 500a shown in FIG. 1. In another embodiment, the method may be also used to fabricate the fingerprint sensor packages 500b and 500c shown in FIGS. 2-3. Elements of the embodiments that are the same or similar as those previously described with reference to FIGS. 1-3, are not repeated hereinafter for brevity.

Please refer to FIG. 4. First, a substrate 200 is provided. Next, a surface mount technology (SMT) process is performed to dispose a fingerprint sensor die 206a on a top surface 201 of the substrate 200 by an adhesion layer 204. A wire bonding process is then performed, so that two terminals of a bonding wire 210 are respectively connected to a pad 208 of the fingerprint sensor die 206a and a pad 202 disposed on the top surface 201 of the substrate 200. In one embodiment, the wire bonding process may comprise a thermocompression bonding method, an ultrasonic bonding method or thermosonic bonding.

Next, FIGS. 4-6 are used to describe the process steps of the compression molding process for forming a molding compound layer 212. As shown in FIG. 4, a plurality of molding compound particles 312 are disposed above the substrate 200 and the first fingerprint sensor die 206a by using a coating method or a deposition method. The molding compound particles 312 encapsulate and cover the top surface 207a (including the sensing area 214a) and the side surface 209a of the first fingerprint sensor die 206a, the bonding wire 210, a side surface of the adhesion layer 204 and a portion of the top surface 201 of the substrate 200. In one embodiment, the molding compound particles 312 may have fillers 313, which can be, for example, silicon dioxide particles, aluminum particles, aluminum oxide particles or any combination thereof, within. In one embodiment, the molding compound particles 312 and the fillers 313 may be disposed on the substrate 200 and the first fingerprint sensor die 206a, respectively. The molding compound particles 312 may comprise the fillers 313, or may not comprise any filler dispersed therein.

As shown in FIG. 5, a mold 314 is then disposed on the substrate 200 to be in contact with the top surface 201 of the substrate 200 to form an accommodation space 316 enclosed by the mold 314 and the substrate 200. In one embodiment, the fingerprint sensor die 206a, the bonding wire 210, the adhesion layer 204 and the molding compound particles 312 are within the accommodation space 316.

As shown in FIG. 6, next, a stress is applied to the mold 314 to soften the molding compound particles 312, so that the molding compound particles 312 turn into a molding compound with fluidity. That is to say, the molding compound particles 312 turn into a molding compound fluid. In one embodiment, the molding compound fluid may comprise a gel or a malleable solid. The molding compound fluid fills the accommodation space 316 entirely and covers a portion of the top surface 201 of the substrate 200, the first fingerprint sensor die 206a, the bonding wire 210 and the adhesion layer 204. Next, a solidification process is performed on the molding compound fluid by, for example, heating the molding compound fluid or illuminating the molding compound fluid with ultra-violet (UV) light. Because the molding compound fluid may be composed of an ultraviolet (UV) cured polymer or a thermally cured polymer, such as an epoxy, the molding compound fluid may turn into a solid molding compound layer 212 through a chemical reaction occurring in the molding compound fluid during the solidification process. Finally the mold 314 is removed from the molding compound layer 212. After performing the aforementioned processes, a fingerprint sensor package 500a in accordance with the embodiment of the invention as shown in FIG. 1 is completely formed.

Because the compression molding process may be performed using the molding compound particles 312 (FIG. 4) comprising the fillers 313 dispersed therein or using the mixture including both the molding compound particles 312 and the fillers 313, the molding compound layer 212, the first portion 212a of the resulting molding compound layer 212, which is disposed over the top surface 207a (including the sensing area 214a) of the fingerprint sensor die 206a, and the second portion 212b of the molding compound layer 212, which is disposed surrounding the side surface 209a of the fingerprint sensor die 206a, may have the fillers 313 dispersed therein. The diameter R of the fillers 313 is less than about 20 μm. The thickness D1 of the first portion 212a may have a range from about 30 μm to about 50 μm, for example, about 40 μm.

Because the compression molding process may be performed using the molding compound particles 312 (FIG. 4) without any filler dispersed therein, the number of fillers in the first portion 212a of the resulting molding compound layer 212, which is disposed over the top surface 207a (including the sensing area 214a) of the fingerprint sensor die 206a, and in the second portion 212b of the resulting molding compound layer 212, which is disposed surrounding the side surface 209a of the fingerprint sensor die 206a, may be zero. That is to say, the first portion 212a and the second portion 212b of the molding compound layer 212 do not have any filler dispersed therein. The thickness D1 of the first portion 212a can be further reduced to be less than or about 10 μm.

In another embodiment, the first portion 212a and the second portion 212b of the molding compound layer 212 may be formed respectively by performing the process steps shown in FIGS. 4-6 twice. The process steps may be used to fabricate the first portion 212a of the molding compound layer 212 with the fillers 313 dispersed therein, or to fabricate the first portion 212a and the second portion 212b of the molding compound layer 212 with the fillers 313 dispersed therein.

In another embodiment, before the compression molding process, a surface mount technology (SMT) process is performed to dispose the second die 230a on the substrate 200 by the adhesion layer 204b. Next, another SMT process is performed to stack the fingerprint sensor die 206b on the second die 230a through the adhesion layer 204a. Next, the process steps shown in FIGS. 4-6 are performed, so that a fingerprint sensor package 500b in accordance with the embodiment of the invention as shown in FIG. 2 is formed.

In another embodiment, before the compression molding process, a surface mount technology (SMT) process is performed to dispose the fingerprint sensor die 206c and the second die 230b on the substrate 200 respectively through the adhesion layers 204a and 204b. The second die 230b is disposed beside the fingerprint sensor die 206c. Next, the process steps shown in FIGS. 4-6 are performed, so that a fingerprint sensor package 500c in accordance with the embodiment of the invention as shown in FIG. 3 is formed.

Figure 7:
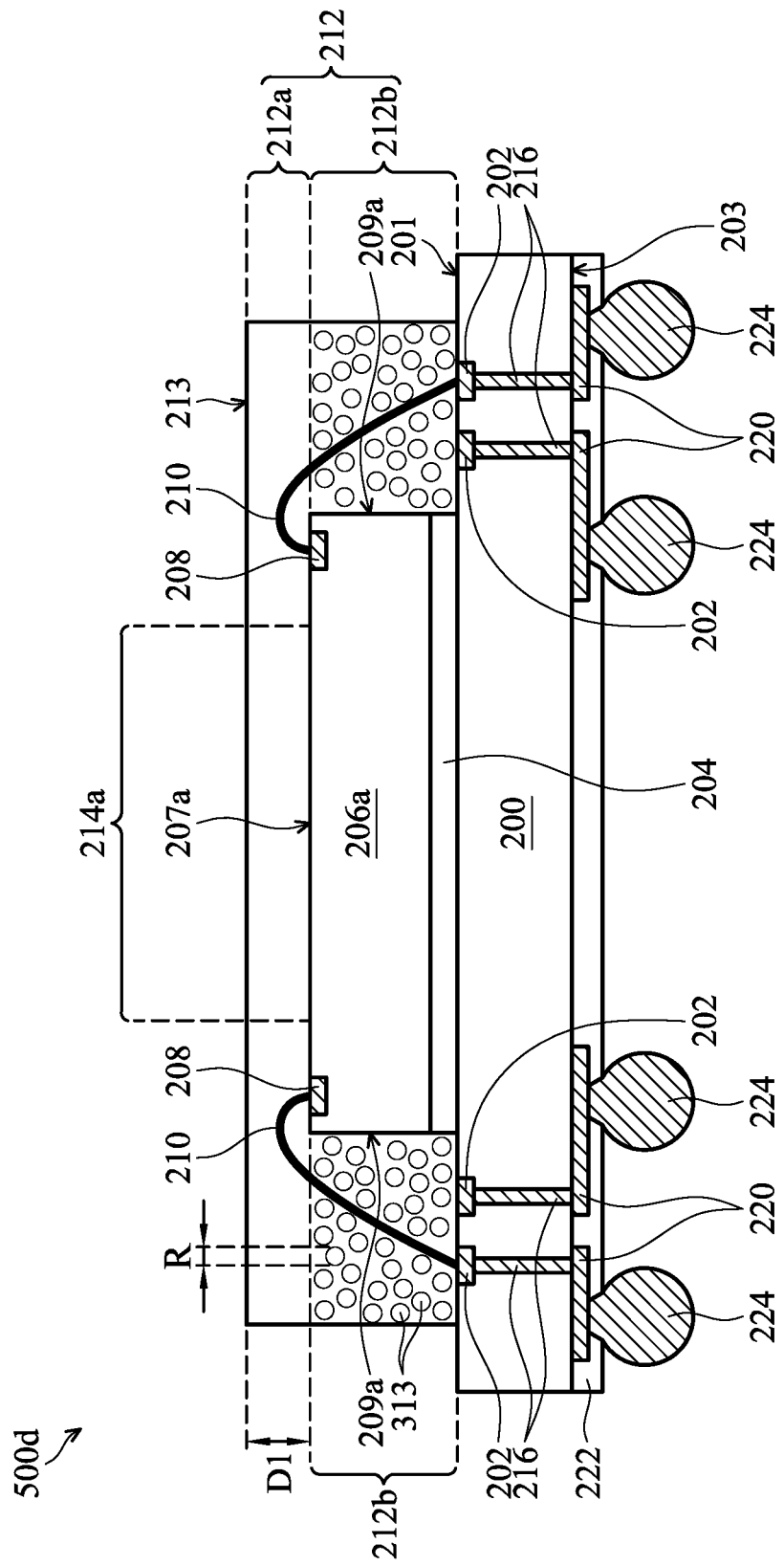
FIGS. 7-9 are cross-sectional views of a fingerprint sensor package in accordance with some embodiments of the invention.

FIG. 7 is a cross-sectional view of a fingerprint sensor package 500d in accordance with some embodiments of the invention. As shown in FIG. 7, the difference between the fingerprint sensor package 500d and the fingerprint sensor package 500a (FIG. 1) is that there are no fillers in a first portion 212a of the molding compound layer 212 disposed over a top surface 207a of the first fingerprint sensor die 206a in the fingerprint sensor package 500d.

Figure 8:
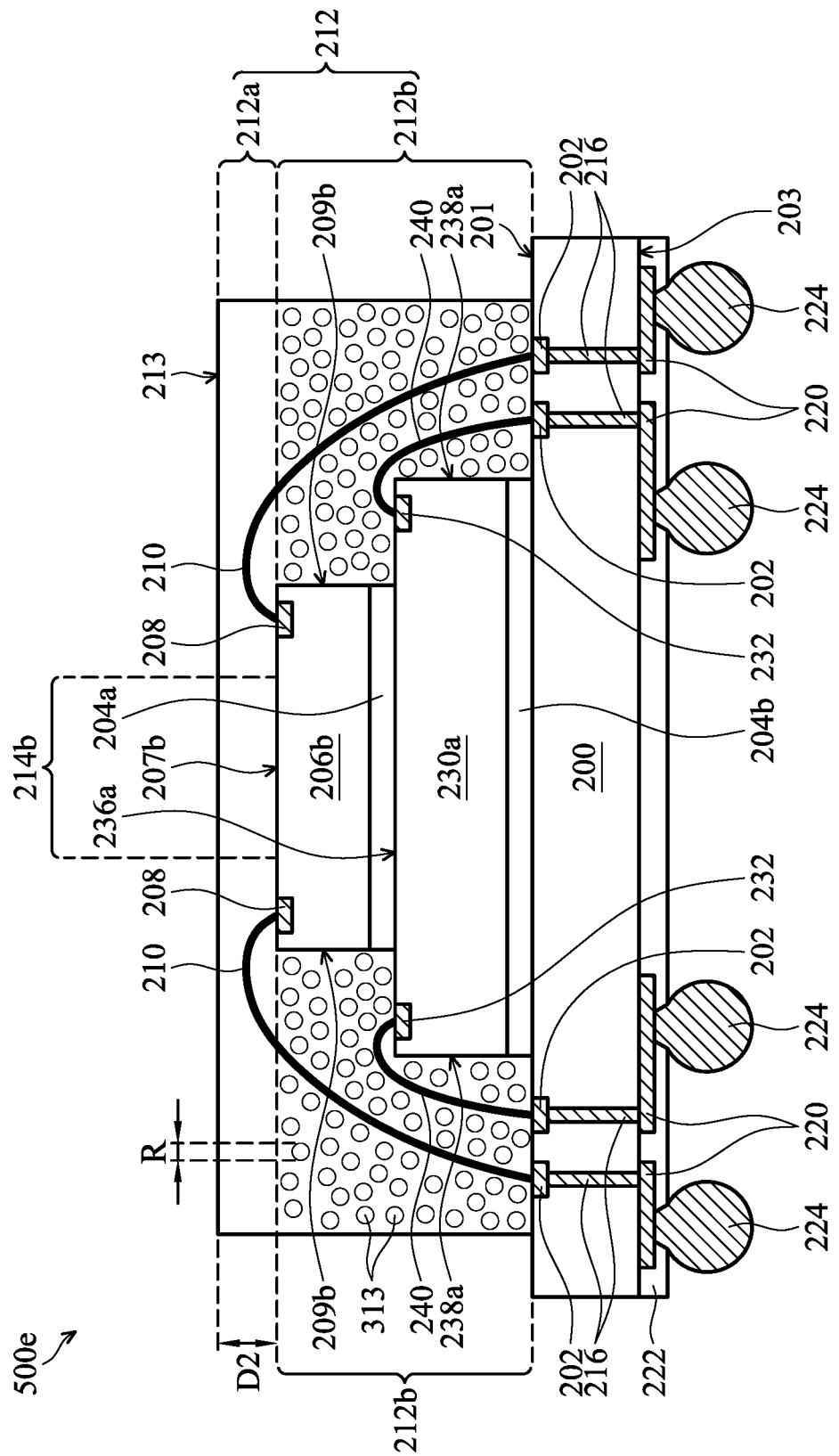

FIG. 8 is a cross-sectional view of a fingerprint sensor package 500e in accordance with some embodiments of the invention. As shown in FIG. 8, the difference between the fingerprint sensor package 500e and the fingerprint sensor package 500b (FIG. 2) is that there are no fillers in a first portion 212a of the molding compound layer 212 disposed over a top surface 207b of the first fingerprint sensor die 206b in the fingerprint sensor package 500e.

Figure 9:
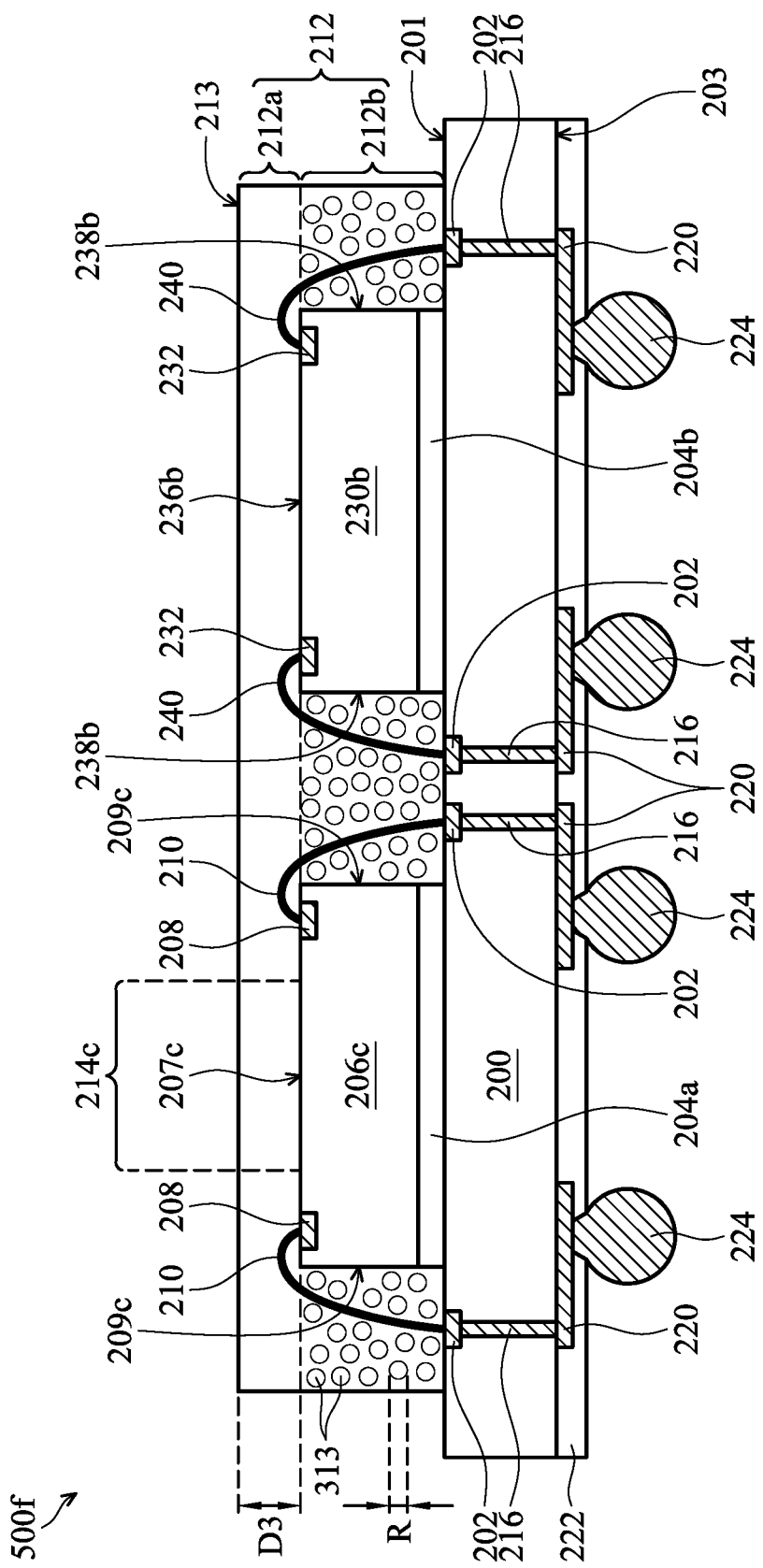

FIG. 9 is a cross-sectional view of a fingerprint sensor package 500f in accordance with some embodiments of the invention. As shown in FIG. 9, the difference between the fingerprint sensor package 500f and the fingerprint sensor package 500c (FIG. 3) is that there are no fillers in a first portion 212a of the molding compound layer 212 disposed over a top surface 207c of the first fingerprint sensor die 206c in the fingerprint sensor package 500f.

Embodiments provide a fingerprint sensor package and a method for fabricating a fingerprint sensor package. The fingerprint sensor package may use a molding compound layer with fillers. Also, the diameter of the fillers is less than or about 20 μm. The thickness of the molding compound layer can be reduced so that the height and volume of the fingerprint sensor package can be reduced and the sensitivity of fingerprint recognition of the fingerprint sensor can be improved. Also, embodiments provide the single-die fingerprint sensor package and the multi-die fingerprint sensor package including, for example, package on package (POP) or package in package (PIP) fingerprint sensor package. The various fingerprint sensor packages have advantages of high device density and multi-functionality. Additionally, the fingerprint sensor package is fabricated by using the compression molding process to form the molding compound layer including the fillers dispersed therein.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A fingerprint sensor package, comprising:
   a substrate;
   a first fingerprint sensor die disposed on the substrate;
   a molding compound layer disposed on the substrate, encapsulating the first fingerprint sensor die;
   wherein there are no fillers in a first portion of the molding compound layer disposed over a top surface of the first fingerprint sensor die, a thickness of the first portion is less than or equal to 10 µm, and the first portion has a planar top surface; and
   a plurality of fillers dispersed in a second portion of the molding compound layer surrounding a side surface of the first fingerprint sensor die; wherein a top surface of the second portion is coplanar with a top surface of the first fingerprint sensor die, and wherein the first portion is directly on the top surface of the second portion.

2. The fingerprint sensor package as claimed in claim 1, wherein the molding compound layer is composed of a material comprising silicon, polyimide (PI), epoxy, polymethyl methacrylate (PMMA) or diamond-like carbon (DLC).

3. The fingerprint sensor package as claimed in claim 1, wherein the fillers are composed of a material comprising silicon dioxide, aluminum, aluminum oxide or any combination thereof.

4. The fingerprint sensor package as claimed in claim 1, further comprising:
   a second die disposed on the substrate, wherein the first fingerprint sensor die is disposed above the second die.

5. The fingerprint sensor package as claimed in claim 4, wherein the molding compound layer encapsulates the top surface and the side surface of the first fingerprint sensor die, and covers a portion of a top surface and a side surface of the second die.

6. The fingerprint sensor package as claimed in claim 4, wherein the second die is a system-on-chip die (SOC die), a sensor die, a memory die or any combination thereof.

7. The fingerprint sensor package as claimed in claim 1, further comprising:
   a second die disposed on the substrate and beside the first fingerprint sensor die.

8. The fingerprint sensor package as claimed in claim 7, wherein the molding compound layer encapsulates top surfaces and side surfaces of the first fingerprint sensor die and the second die.

9. The fingerprint sensor package as claimed in claim 7, wherein the second die is a system-on-chip die (SOC die), a sensor die, a memory die or any combination thereof.

10. The fingerprint sensor package as claimed in claim 1 wherein a diameter of the fillers is less than 20 µm.

* * * * *